United States Patent
Anzaki et al.

(10) Patent No.: US 6,761,984 B2
(45) Date of Patent: Jul. 13, 2004

(54) ARTICLE COATED WITH PHOTOCATALYST FILM, METHOD FOR PREPARING THE ARTICLE AND SPUTTERING TARGET FOR USE IN COATING WITH THE FILM

(75) Inventors: Toshiaki Anzaki, Osaka (JP); Daisuke Arai, Osaka (JP); Yoshifumi Kijima, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/168,253

(22) PCT Filed: Dec. 21, 2000

(86) PCT No.: PCT/JP00/09092

§ 371 (c)(1),
(2), (4) Date: Sep. 23, 2002

(87) PCT Pub. No.: WO01/46488

PCT Pub. Date: Jun. 28, 2001

(65) Prior Publication Data

US 2003/0054178 A1 Mar. 20, 2003

(30) Foreign Application Priority Data

Dec. 21, 1999 (JP) .............................. 11-363022
Dec. 12, 2000 (JP) ........................... 2000-378033

(51) Int. Cl.$^7$ .............................. B32B 9/00; C23C 14/34
(52) U.S. Cl. ...................... 428/697; 428/701; 428/702; 502/349; 502/350; 106/286.1; 106/286.4; 106/286.8; 204/192.1; 204/195.15
(58) Field of Search .............................. 428/426, 428, 428/432, 688, 689, 702, 697; 502/242, 308, 309, 349, 350; 106/286.1, 286.4, 286.8; 204/192.1, 192.15

(56) References Cited

U.S. PATENT DOCUMENTS

| | | | |
|---|---|---|---|
| 6,037,289 A | * | 3/2000 | Chopin et al. .................. 502/2 |
| 6,103,363 A | * | 8/2000 | Boire et al. .................. 428/325 |
| 6,362,121 B1 | * | 3/2002 | Chopin et al. ........... 427/376.2 |
| 6,368,668 B1 | * | 4/2002 | Kobayashi et al. ...... 427/376.2 |

FOREIGN PATENT DOCUMENTS

| JP | 10-66878 | 3/1998 |
|---|---|---|
| JP | 10-66879 | 3/1998 |

(List continued on next page.)

OTHER PUBLICATIONS

Bickley, Roger I. et al. "A Comparative Study of the photocatalytic Activities of Iron–Titanium (IV) Oxide Photocatalysts prepared by Various Methods; Spray Pyrolysis, Impregnation and Co–Precipitation", Stud Surf Sci Catal, (1995), vol. 91, pp. 589–596.

Primary Examiner—Deborah Jones
Assistant Examiner—G. Blackwell-Rudasill
(74) Attorney, Agent, or Firm—Merchant & Gould P.C.

(57) ABSTRACT

This invention relates to an article having a substrate with a photocatalyst coating film formed thereon by ae sputtering method, characterized in that the photocatalyst coating film comprises titanium oxide as a main component and at least one kind of metal having a sputtering rate for Ar being 0.9 to 2.7 times that of Ti, preferably at least one kind of metal selected from the group consisting of Fe, V, Mo, Nb, Al and Cr, in an amount of 0.01 to 10 wt % in terms of the sum of such metals. The coating film is formed by a method using a Ti metal sputtering target or a Ti sub-oxide sputtering target containing the metal in an amount of 0.01 to 10 wt % in terms of the sum of such metals, or a method using two kinds of targets for two sputtering cathodes and applying reversing potential so as to have a cathode and an anode alternately.

4 Claims, 6 Drawing Sheets

FOREIGN PATENT DOCUMENTS

| | | |
|---|---|---|
| JP | 10-158814 | 6/1998 |
| JP | 10-330131 | 12/1998 |
| JP | 11-60281 | 3/1999 |
| JP | 11-92176 | 4/1999 |
| JP | 11-092176 * | 4/1999 |
| JP | 2000-126613 * | 5/2000 |
| JP | 2000-140636 | 5/2000 |
| JP | 2000-345320 | 12/2000 |

* cited by examiner

ARTICLE COATED WITH PHOTOCATALYST FILM, METHOD FOR PREPARING THE ARTICLE AND SPUTTERING TARGET FOR USE IN COATING WITH THE FILM

BACKGROUND OF THE INVENTION

1. Field of the Invention

When a substrate coated with a photocatalyst film is a glass plate, the glass plate is used in a wide range of fields, for example, window glass for architectural windows, windows for LCDs (liquid crystal display) and PDPs (plasma display panel), a glass substrate for DNA analysis that is used in the field of biotechnology, solar cell panel, etc. Further, when a substrate coated with a photocatalyst film is a resin frame, contamination preventive properties are given to such equipment and facilities as portable information tenninal devices, sanitary facilities, medical facilities, electronic devices, etc. Thus, when coated on various kinds of substrates, a photocatalyst film provides properties to the substrate surfaces by which they exhibit very little contamination or any contamination is easily removed. Further, a photocatalyst film has anti-bacteria action and is applicable to bio-medical inspection chips such as a vio chip or a chemical chip. This invention related to an article having a substrate coated with a photocatalyst film a method for preparing the article and sputtering targets for use in coating the film.

2. Description of the Related Art

In Japanese Laid-Open Patent Publication No. HEI 10-66879, glass plates coated with a titanium oxide film, a zinc oxide film or a tungsten oxide film are disclosed as articles with a photocatalyst film formed on substrates and it is stated that these are best suited for containing such metals as platinum, palladium, nickel, copper, tin in this photocatalyst film in order to improve the photocatalyst activity. It is also stated that this photocatalyst film is coated by reactive sputtering in inactive gas containing oxygen using a metal corresponding to metal oxide forming the photocatalyst film as a target.

In Japanese Laid-Open Patent Publication No. HEI 11-92176, articles coated with a photocatalyst film comprising titanium oxide, etc. obtained by a sputtering method and containing such metallic ions as platinum, nickel, chrome, cobalt, tin, niobium, tantalum doped into its surface by the ion implanting method as disclosed.

Further, in the Japanese Laid-Open Patent Publication No. HEI 11-60281, a photocatalyst glass with a first layer of $SiO_2$ film containing $Al_2O$ formed on the surface of a soda lime silica glass and a second layer comprising $TiO_2$ as a main component formed thereon is disclosed. It is also stated that it is better to mix a metal oxide of $Al_2O_3$, $P_2O_5$, $B_2O$, $ZrO_2$, $P_2O_5$, $SnO_2$, or $Ta_2O$ into the $TiO_2$ film thoroughly for the purpose of improving film minuteness, film strength, and alkali resistance, giving conductivity and cutting ultraviolet rays. It is further stated that these metallic oxide films are coated by thermally decomposing such organic metallic compounds as metallic alkoxide, metallic acetylacetonate, etc.

Further, in FIG. 1 of Japanese Laid-Open Patent Publication No. HEI 10-330131, a photocatalyst coated glass article having a good hydrophilic multi-layer structure comprising an $Si_2$ base layer, a $TiO_2$ photocatalyst layer and an $SiO_2$ top layer formed on a plate glass is disclosed. It is stated that this photocatalyst layer comprises mainly titanium oxide with $Al_2O$, $Y_2O$, $Ta_2O_5$ and $La_2O_5$ intermixed. It is also stated that these photocatalyst metallic oxide layers are laminated and formed by an electron beam vaporization method.

Out of the existing technology described above, the photocatalyst film disclosed in Japanese Laid-Open Patent Publication No. HEI 10-66879 has such metals as platinum, palladium, etc. mixed in a titanium oxide film in order to increase photocatalyst activity. However, in the oxygen reactive sputtering method using a metal target of titanium, there was such a problem that it was difficult to contain a fixed amount of platinum or palladium as a catalyst activity improving agent in the metallic state without oxidizing the platinum or palladium while oxidizing titanium when coating a titanium oxide film containing such metals as platinum. Further, in the sputtering method using a target of titanium oxide, there was such a problem that it was difficult to a manufacture oxide sintered matter having metallic powder of platinum dispersed uniformly therein.

In the doping of metallic ion by the ion implanting method disclosed in Japanese Laid-Open Patent Publication No. HEI 11-92176, there were such problems that 1) excessive or insufficient doping giving uneven density resulted as metallic ions were dispersed in the depth direction of a film so that uniform doping of the film was impossible, 2) the grid disorder around the substituting side of the implanted metal becomes large and as a result, a dopant does not only function as a donor or an acceptor but also a drop of the photocatalyst activity is caused by increase of recombination center, 3) an amount of ions implanted cannot be greatly increased, 4) several kinds of dopants cannot be implanted at a time while controlling their densities, and 5) as metallic ions are used for doping by ion implantation, it is difficult to apply the metallic ion doping to large sized substrates such as structural window glasses, solar cell panels that are installed on the roof of a house, or glass plates used in relatively large displays.

In the existing technology stated in Japanese Laid-Open Patent Publication No. HEI 11-60281, there was such a problem that after coating organic metallic compounds such a metal alkoxide, metallic acetylacetonate, etc. on a substrate, it was necessary to heat the substrate at a high temperature of 500~600° C., so this technology could not be applied to thermally restricted substrates such as resin made substrates.

Further, the photocatalyst layer of the existing technology shown in FIG. 1 of Japanese Laid-Open Patent Publication No. HEI 10-330131 is laminated and coated by an electron beam vaporization method and it is therefore difficult to apply this technology to large substrates such as, for example, a structural window glass, a solar cell panel installed on a roof of a house, and a relatively large display unit.

This invention is made for solving problems involved in the existing technologies described above and it is a first object to provide articles having more improved photocatalyst activity. A second object of this invention is to provide an article having improved photocatalyst activity even when the surface is large. A third object of this invention is to provide a photocatalyst function to the surface of a substrate even when its thermal resistance is relatively weak. A fourth object of this invention is to provide a method to efficiently coat a substrate with an improved photocatalyst film.

SUMMARY OF THE INVENTION

This invention relates to an article having a substrate with a photocatalyst coating film formed thereon by a sputtering method, characterized in that the photocatalyst coating film comprises: 1) titanium oxide as a main component and 2) at least one kind of metal having a sputtering rate for Ar, which has at least one kind of energy in the ion energy are of 100 to 2000 eV, being 0.9 to 2.7 times that of Ti, preferably at least one kind of metal selected from the group consisting of Fe, V, Mo, Nb, Al and Cr.

The photocatalyst film of this invention contains titanium oxide as a main component and at least one metal selected from the group consisting of Fe, V Mo, Nb, Al and Cr as a component in a small amount. In order to improve the photocatalyst activity of titanium oxide, one or more than two kinds of metals can be contained.

Generally, the improvement of the photocatalyst activity of titanium oxide by metal ion doping has been studied for a long time, and many metals have been examined as additive metals having the effect of improving the photocatalyst activity (for example, "Chemical Introduction 39, Inorganic Photochemical", 1st Edition, Page 128, Gakkai Shuppan Center, 1983, "Titanium Oxide", 1st Edition, Page 178, Gihodo, 1991). The reason for the improvement of the photocatalyst activity of titanium oxide by these metals is not clear but is considered that these metal atoms are replaced by some of the titanium atoms bonding to oxygen in the titanium oxide, the coordinating state of the atoms changes, resulting in an increase in active catalyst sites (for example, a defective site in a so-called dangling bonded state wherein the coordination of the atoms is cut and part of electrons belonging to oxygen or titanium are placed in the free state having no bonding mate). It is also considered that the catalytic action is improved when the density of easily exciting electrons and electron holes is increased even at room temperature as a result of metallic doping.

This invention relates to an article having a substrate and a photocatalyst coating film formed thereon by the sputtering method. The present inventors confirmed that effective improvement of photocatalyst activity could not be recognized simply by doping a titanium oxide film with well known metals by an ordinary method only and as a result of detailed study, found that the problem can be solved by preparing a photocatalyst film by two methods described below.

The inventors found two methods for forming a photocatalyst coating file: 1) a method for forming a film by the sputtering method using a Ti metal sputtering target or a Ti sub-oxide sputtering target containing at least one kind of metal having a sputtering rate (also called a sputter rate) for Ar, which has at least one kind of energy in the ion energy area of 100 to 2000 eV, being 0.9 to 2.7 times that of Ti, preferably at least one kind of metal selected from the group consisting of Fe, V, Mo, Nb, Al and Cr, in an amount of 0.01 to 10 wt % in terms of the sum of such metals and 2) a method for forming a film by the sputtering method by providing two kinds of targets for two sputtering cathodes and applying reversing potential so as to have a cathode and an anode alternately.

In the method 1, a metal for doping a titanium oxide sputtering film is at least one kind of metal having sputtering rate for Ar, which has at least one kind of energy in 100 to 2000 eV ion energy area, being 0.9 to 2.7 times of that of Ti, preferably at least one kind of metal selected from the group of Fe, V, Mo, Nb, Al and Cr.

A metal doped titanium oxide film is formed on a substrate using a Ti metal sputtering target or a Ti sub-oxide sputtering target containing this metal in an amount of 0.01 to 10 wt % in terms of the sum of such metals by a reactive sputtering method using oxygen gas or an ordinary sputtering method. At this time, if the sputtering rate of the metal differs from that of Ti, the composition of the sputtering target may become largely different from that of the formed film. An uneven metal doping, that is, a metal segregation is caused and the improvement of the photocatalyst activity is impeded. Therefore, the sputtering rate of the doping metal should be 0.9 to 2.7 times that of Ti, preferably 0.9 to 2.3 times. If the sputtering rate of the metal is less than 0.9 times that of Ti, the film composition becomes Ti rich, which is not preferable, and the metal doping effect is scarcely displayed. If larger than 2.7 times, the film composition becomes metal rich and metal segregation is recognized. This is also not preferable as the improvement of the photocatalyst activity is impeded. Such change in composition and metal segregation can be further suppressed when the sputtering rate of the metal is made smaller than 2.3 times that of Ti.

A sputtering method in a pressure reduced argon containing gas or a reactive sputtering method in oxygen plasma using pressure reduced mixed gas containing argon and oxygen using a metal corresponding to such oxide as a target can be adopted as a sputtering method. As a means for generating discharge plasma in the above sputtering method, DC glow discharge, intermediate frequency glow discharge, or high frequency glow discharge can be used. In the sputtering method using a metal as a target, it is desirable to use oxygen in an amount of 10 to 1000% in terms of the sum of argon and oxygen. The sputtering is better performed under a reduced pressure of 0.07 to 7 Pa.

For a sub-oxide target that is used for implanting more than two kinds of metals in a photocatalyst coating film, a mixed powder of metal oxide or compound metal oxide powder can be used. According to the degree of conductivity of the target that is obtained, either DC or AC or a high frequency power source is used. As a metal target, an alloy target or a mixed metal target of powdered sintered matter is used.

The method 2 described above is a method for sputtering two targets at the same time. In this method, two cathodes having metal or metal oxide sputtering targets forming a photocatalyst coating film are arranged adjacent to each other and glow discharge plasma is generated by applying voltage by reversing the polarities of these cathodes alternately so that one cathode becomes the positive pole when the other is the negative pole or vice versa, thereby sputtering two targets simultaneously.

At this time, if the sputtering rate of the metal differs largely from that of Ti, the target composition and the formed film composition become largely different or uneven metal doping, that is, metal segregation is caused and the improvement of the photocatalyst activity is impeded. So, for the same reason as in the method 1, the sputtering rate of the doping metal should be 0.9 to 2.7 times that of Ti, preferably 0.9 to 2.3 times.

In the above two sputtering methods, a more crystalline catalyst film can be coated on a substrate even at a low temperature by forming the film while applying the plasma to the film by applying a bias voltage to the substrate or closing the distance between the substrate and targets.

Further, when coating the photocatalyst film on a substrate having a relatively large surface, for example, a window glass plate for a structure, it is preferable to coat the substrate by passing in front of a sputtering target for coating a uniformly thick film on the entire substrate.

In this invention, when metals are distributed uniformly in a sputtering target in advance, or when two kinds of targets in different compositions are sputtered simultaneously, a uniform film composition can be achieved. As the film can be coated using the method 1 or 2, there are no such problems as non-uniformity of metals that becomes a problem in the ion implanting method, drop in photocatalyst activity caused by the grating disorder of titanium oxide, control of metal doping amount, difficulty of doping of plural metals, etc. Further, as this is a sputtering method, it is easy to apply to a substrate having a large surface area such as a window glass of a structure, a solar cell panel installed on a house roof, or a glass plate that is used for a relatively large display unit and, also, is suited to bio chips and chemical chips for which highly uniform quality is demanded.

A specific example of a doping metal in this invention is at least one metal selected from the group consisting of Fe, V, Mo, Nb, Al and Cr. Of these metals, Fe, V, Mo, Nb and Cr act as donors in a titanium oxide film, supply electrons and contribute to improvement of photocatalyst activity by increasing carrier density. Aluminum acts as an accelerator in the titanium oxide, supplies electron holes and also contributes to the improvement of photocatalyst activity by the increase in carrier density. Of these metals, Fe, KV and Mo have a large effect in improving catalytic activity, are stable, and are especially preferable.

When using a donor and an acceptor simultaneously, if they are simply mixed, carriers supplied by them offset each other when generated and are not preferable. It is therefore preferred to separate the existing areas of a donor and an acceptor in the film in the direction of depth so that different kinds of generated carriers do not bind again. according to a crystallographic study by the X-ray diffraction analytical method of the photocatalyst film of this invention, the photocatalyst film can exhibit various kinds of crystal structure. For example, a titanium oxide anatase structure, a mixed structure of microcrystalline and amorphous anatase titanium oxide, a mixed structure of anatase crystal and rutile crystal, and a structure containing a considerable amorphous layer can be taken. In any film structure, the photocatalyst activity is larger than that of a structure composed of a single component of titanium oxide.

The photocatalyst film of this invention does not necessarily require complete crystallinity. it is sufficient if there is a certain order of intermediate distance in the grating group of titanium oxide. In the photocatalyst film of this invention, in connection to an energy band structure followed by electrons and electron holes, if the quantum density at the edge portion of the energy band is in a slightly dim state for the amorphous structure, the photocatalyst activity is rather large. From this, in the photocatalyst film of this invention, absorption of light containing visible light in a long wavelength and generation of a carrier take place when compared with titanium oxide alone.

The content of the metal oxide in a small amount in the photocatalyst film in terms of the sum of such metal oxide is preferred at 0.01 to 10 wt % on the metal base in the film. At a content of 0.01 to 10 wt %, the catalyst activity improving effect is scarcely recognized and when exceeding 10 wt %, the intermediate distance order of the grating structure of titanium oxide is disturbed remarkably, the moving distance of the photocatalyst carrier becomes short, and the photocatalyst activity becomes small. Therefore, a content above 10 wt % is not preferable.

Kinds of substrates that are used in this invention are not limited particularly but, for example, such inorganic materials as glass ceramics, quartz, metallic materials such as aluminum and stainless steel, and resin materials such as polycarbonate, polymethyl methacrylate, silicone, polystyrene, polyimide etc. can be used.

When light is applied to an article of this invention, the photocatalyst film is excited and such actions as antibacterial, deodorization, decomposition of organic articles, and hydrophilic operation are displayed. Thus, the articles of this invention are given properties whereby the surface is scarcely contaminated or contamination is easily removed and bacteria or viruses are rarely bred.

The metal contained in the photocatalyst film of this invention as a main component coated on a substrate for improving the photocatalystic activity can be distributed uniformly in the direction of the thickness of the titanium oxide photocatalyst film or distributed in different amounts in the thickness direction. When distributing a different amount in the thickness direction, a greater amount shall be distributed to the side of the photocatalyst film close to the substrate or a greater amount may be distributed to the side of the photocatalyst film receiving the light opposite to the substrate side.

To make the content of the above metal different in the direction of thickness of the photocatalyst film, a metal film or a metal oxide film or a titanium oxide film containing metal is formed on a substrate and a titanium oxide film is laminated thereon or a titanium oxide film is formed on a substrate and a laminated article is formed by laminating a titanium oxide film containing the above-mentioned metal or a metal oxide thereon, and implanting a metal into the titanium oxide film through the surface of this laminated article by the thermal diffusion method. The photocatalyst film thus obtained is able to accelerate the diffusion of impurities and film crystallization simultaneously. With a metal as an additive in the direction of thickness of the film, it is possible to diffuse the carrier polarity by making the energy band structure asymmetrical while providing an inclined concentration. As a result, the film can be made to have a high catalyst activity preventing the recombination quenching in a film. This is particularly preferable when using the photocatalyst film for solar cell elements.

A metal can be contained in a photocatalyst by thermal diffusion. One method is to heat a substrate when forming a laminated material on the substrate and another method is to post heat a laminated material formed on a substrate. Both of these methods can be used. In order to contain metal oxide in a photocatalyst film by thermal diffusion, the temperature of a substrate when coating on a laminated material is normally above 150° C. and it is better to beat the substrate to 250° C. or above. Further, to diffuse and contain a metal in a laminated material formed on a substrate by post-heating, it is normally more preferable to heat the substrate to 150° C. or above. The upper limit of the heating temperature in both methods can be decided in a range so as not to damage the substrate.

The thickness of a photocatalyst film comprising titanium oxide as a main component should be set at more than 20 nm in order to provide photocatalyst activity at a level considered practical. Also, a thickness of below 2000 nm is preferred from the economical viewpoint inasmuch as the photocatalyst activity does not increase even at a thickness greater than 2000 nm.

This invention is to provide a Ti metal sputtering target or a Ti sub-oxide sputtering target containing at least one metal selected from the group of metals at 0.01 to 10 wt % of the sum of such metals. These targets are useful for forming the metallic ion doped photocatalyst film and are capable of efficiently and stably supplying photocatalyst films having high photocatalyst activity.

The above and other objects, features and advantages of the present invention will become more apparent from the following description when taken in conjunction with the accompanying drawings.

DESCRIPTION OF THE PREFERRED EMBODIMENTS

Figure 1:
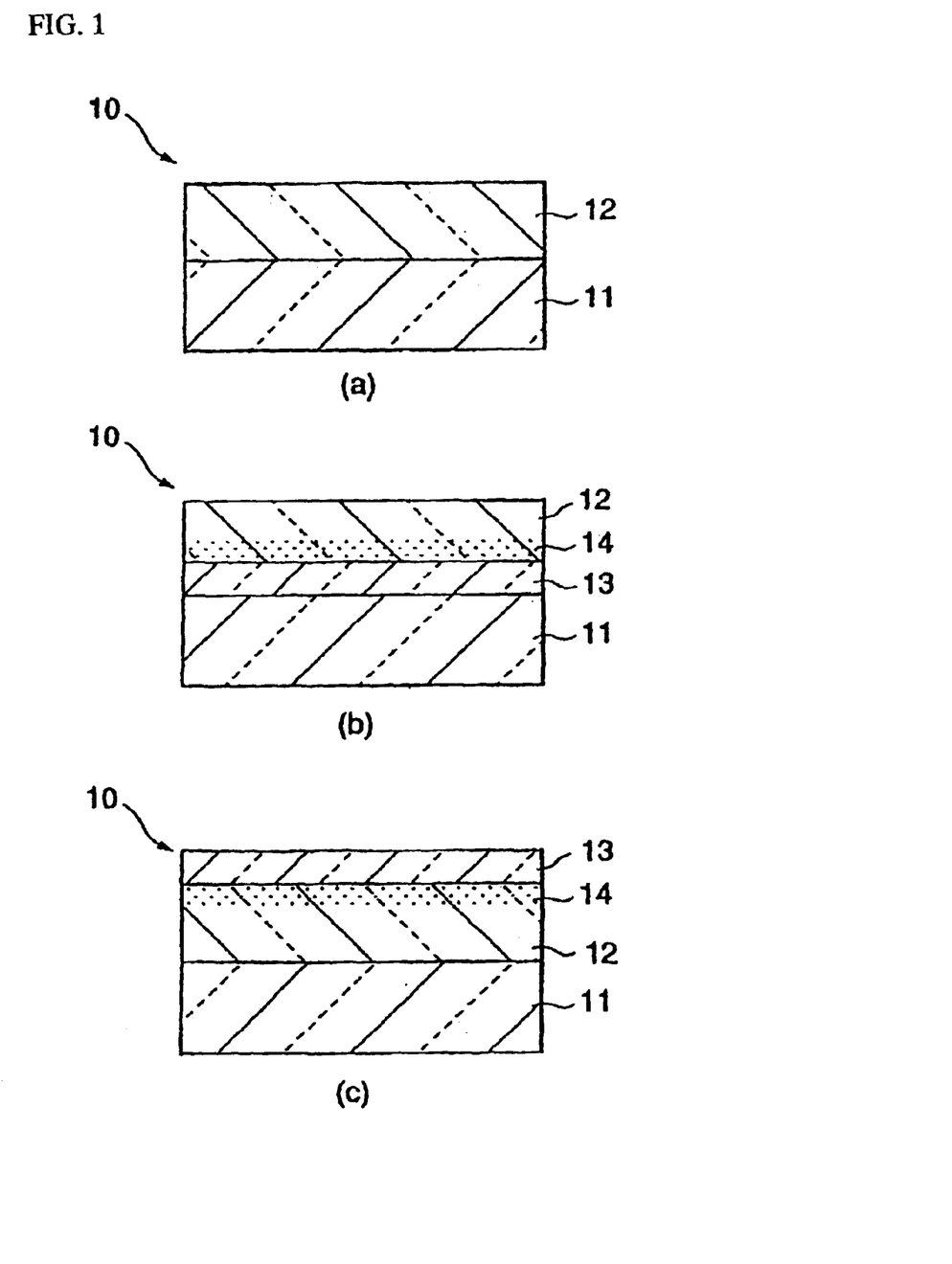
FIG. 1 is a sectional view of preferred embodiments of an article coated with a photocatalyst film of this invention.

FIG. 1 is a sectional view of a photocatalyst film coated article as an embodiment of this invention. FIG. 1(a) shows an article 10 of this invention having a photocatalyst film 12 formed on a glass plate 11 as a substrate. FIG. 1(b) shows the article 10 of this invention having the glass plate 11 with a metal oxide film 13 and the photocatalyst film 12 laminated and coated thereon with a metal contained in the substrate side by thermal diffusion, wherein a diffusion layer 14 exists in the photocatalyst film 12. In FIG. 1(c), the photocatalyst film 12 and the metal oxide 13 are laminated in that order on the glass plate 11 as a substrate, the metal oxide is contained in the photocatalyst film surface by thermal diffusion, and the diffusion layer 14 is formed.

Figure 2:
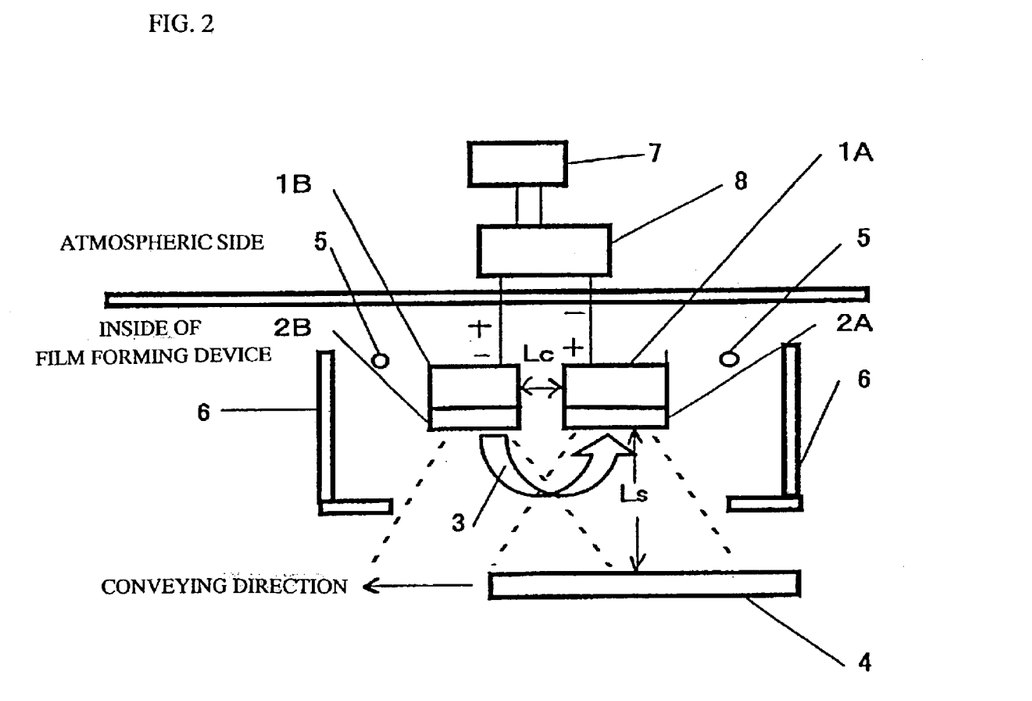
FIG. 2 is an essential part sectional view of a sputtering device using the photocatalyst film coating method of this invention.

FIG. 2 is a sectional view of essential parts of a sputtering device for explaining a method for coating the photocatalyst film of this invention on a substrate 4. Argon gas or oxygen gas is introduced from a gas induction tube 5 into a film forming device including a gas retaining plate 6 that forms the photocatalyst film on a substrate 4. At the same time, the inside of the film forming device is exhausted by a vacuum exhaust pump and regulated to an atmospheric space reduced to a fixed pressure. The pressure and gas composition of the atmosphere of this pressure reduced space is regulated by a vacuum exhaust pump, an induced gas amount and a pressure regulating valve (not shown) so as to enable the sputtering.

When negative voltage is applied to cathodes 1A, 1B from a power source 7, targets 2A and 2B are sputtered by such positive ions as argon in glow discharge plasma generated on the surfaces of the targets. Sine waves, pulse waves, and time asymmetrical waves can be used for applying voltage to the cathodes. Any wave capable of Fourier development is also suitable. If targets are not conductive, high frequency is applied. The reference zero potential of the applied voltage waveform is normally the same as the earth potential of a film forming device. further, a DC bias having a polarity common to the two cathodes may be applied at the same time. In this case, the earth potential of a film forming device and the reference zero potential of the above-mentioned waveform are normally floating and have no relation to each other.

A negative voltage is applied to the cathodes 1A and 1B from the power source 7. At this time, electrical charges accumulated on the surfaces of the targets are destaticized by reversing polarities of the respective cathodes alternately by an oscillator (a polarity converter) 8 so that the cathode 1B becomes the positive pole when the cathode of the cathode 1A is the negative pole while the cathode 1A becomes the positive pole when the cathode 1B is the negative pole. From a instantaneous point of view, the targets 2A, 2B provided on the surfaces of the two cathodes are sputtered by the alternately reversing glow discharge 3 generated by applying a negative voltage to one cathode and a positive voltage to the other cathode.

A reversing frequency for reversing polarity is preferred at 10 kHz or above. If less than 1 KHz, the charge eliminating action on the target surfaces drops, plus ion action to voltage oscillation is delayed and the charge eliminating action on the target surfaces is scarcely obtained and therefore, it is preferred to set the reversing frequency at 1 MHz or below.

Waveforms of applied voltage are not especially limited if they are well-balanced applied voltage waveforms such as sine waves, square pulse waves, and time asymmetrical waves in which charges of surfaces of the two target materials are neutralized relative to the time base.

When the cathode polarity is reversed by the above-mentioned preferable reversing frequency, the so-called cathode sputtering is carried out intermittently for each target microscopically. When the reversing period of polarity is selected in the preferable range described above, the targets 1A and 1B are sputtered at the same time when viewed in broad perspective and the photocatalyst film is coated on the substrate 4.

Electric charges accumulated on the two target surfaces are neutralized by reversed potential and reversed current, and two targets are sputtered while destaticized. Therefore, no thermal shock is caused during the dielectric breakdown in the photocatalyst film by the electric charges accumulated on the film surface. As a result, abnormal discharge (arcing, corona, etc.) resulting from the thermal shock is suppressed or not longer caused.

By the cleaning action to sputter the two target surfaces by glow discharge plasma, the photocatalyst film is coated on the targets while removing the film accumulated on the eroded surfaces of the targets. Therefore, the accumulation of electrical insulating film on the eroded surfaces of the two targets is suppressed, the so-called anode electrode vanishing phenomenon observed when coating a metal oxide film using a ordinary single target is not incurred and the glow discharge plasma does not stop during the photocatalyst film coating. Thus, even when a metal is used as a target, a reactive gas such as oxygen for the sputtering gas or the substrate is heated, and it is possible to coat a fine photocatalyst film of metal oxide stably on the substrate.

When a target is of a planar (a rectangular parallelepiped) type, a backing plate that is normally composed of copper as a main component, a cooling mechanism for cooling the backing plate and a reinforced magnet for constructing a magnetron are provided on the back of each target in one integral body with the target or separately. Further, in order to increase close adhesion on the surfaces of a target material and a backing plate, it is better to plate a normally copper made backing plate surface with nickel or indium.

Further, when a cylindrical shape target is used, it is possible to use such a well known method whereby a cylindrical target material is prepared on the surface of a cylindrical backing cylinder, magnetron magnets are arranged linearly on the inner tangent line in the longitudinal direction, and this cylinder is rotated together with a target without moving the magnet. As a result, the whole surface of the target can be provided as an erosion area and the target use efficiency can be improved. In addition, the cooling effect of the target surface resulting from the shift caused by the erosion can be improved.

The results when the photocatalyst film of this invention is coated on a glass plate will be shown below in detail by comparing the embodiments with comparison examples.

(Film Coating Conditions)

Distance Ls between a substrate and a target: 100 mm

Distance Lc between two targets: 30 mm

The distance between two targets is preferred as close as possible to a distance between a substrate and a target or less for uniform doping.

Figure 6:
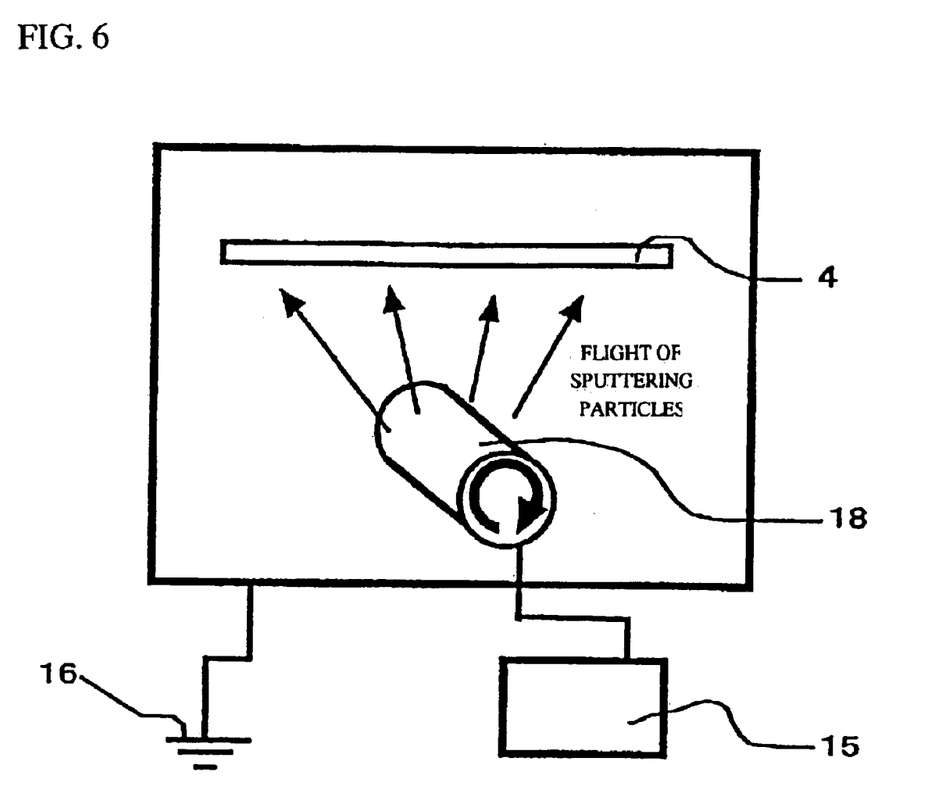
FIG. 6 is a schematic diagram showing yet another sputtering device using the photocatalyst film coating method of this invention (the DC cylindrical method).

Sputtering method: Largely divided into the following two methods:
1) A DC sputtering using a DC power source (expressed as DC in Tables 1~3: see FIGS. 3, 4 and 6; one DC power source is connected to each of the two targets in FIG. 4)
2) An applied voltage alternate reverse sputtering using an internal frequency power source (expressed as the DM method in Table 1~3: A power source capable of applying a sine wave with a reversing frequency set at 40 kHz by the oscillator in FIG. 2 is used.).

Sputtering power: Regulated in the range of voltage 400~600V, charging electric power 2~20 kW.

Sputtering gas: When coating a metal oxide film on a metal oxide used as a target, gas containing 1~15 vol. % oxygen in argon is used; and when coating a metal oxide film on a metal used as a target, argon gas containing 10~50 vol. % oxygen is used.

Sputtering pressure: 0.5 Pa

Substrate temperature at film coating: As shown in Tables 1~3. "Room Temp." shown in Tables 1~3 indicates that the substrate was not heated.

Heat treatment after film forming: As shown in Tables 1~3. The heat treatment was carried out under atmospheric conditions.

Target composition: Shown in metal base wt %: (photocatalyst activity improving metal/(photocatalyst activity improving metal+titanium metal)×100. In Tables 1~3, shown in the form "Ti-aM". This denotes a Ti main component target containing a wt % M Metal. However, in the case of a sub-oxide target, a value converted to a metal base.

Sputtering rate (M/Ti): Ratios of sputtering rates of added metal to those of Ti when sputtered in Ar at 500V are shown in Tables 1~2. Values of sputtering rates are shown in, for example, "Metal Data Book", Revised 3 Edition. Page 389, Maruzen (1993) and "Basis of Thin Film Preparation", First Edition, Pages 126~130, Nikkan Kogyo Shimbunsha (1983).

(Photocatalyst Film)

Adding metal ratio: The amount of metal contained in the film is expressed in the metal base. Values of added metals/(added metal+Ti) are shown in Tables 1~3.

Film thickness: Using a transmission electron microscope, film thickness was measured by observing the fractured surfaces.

(Evaluation of Photocatalyst Film Activity)

Triolein (glycerol triolate, $C_{17}H_{33}COOCH(CH_2OCOC_{17}H_{33})_2$) was coated on a 100 mm square sample surface to 0.1 mg/cm$^2$, ultraviolet rays were applied successively at a strength 3 mW/cm$^2$ using an UV lamp, and rates of triolein that is decomposed with lapse of time were measured. Using glass plates without the photocatalyst film formed as reference samples, changes in triolein weight on the photocatalyst film caused by ultraviolet rays applied were measured 3 times; after 48 hours, 60 hours and 90 hours, and the photocatalyst activity was classified into the following four ranks by times required for the complete decomposition of triolein.

Almost 100% of triolein is decomposed within 48 hours: ⊙

Almost 100% of triolein is decomposed within 60 hours: ○

Almost 100% of triolein is decomposed within 90 hours: Δ

After 90 hours, triolein still remains: X

Embodiment 1

Figure 3:
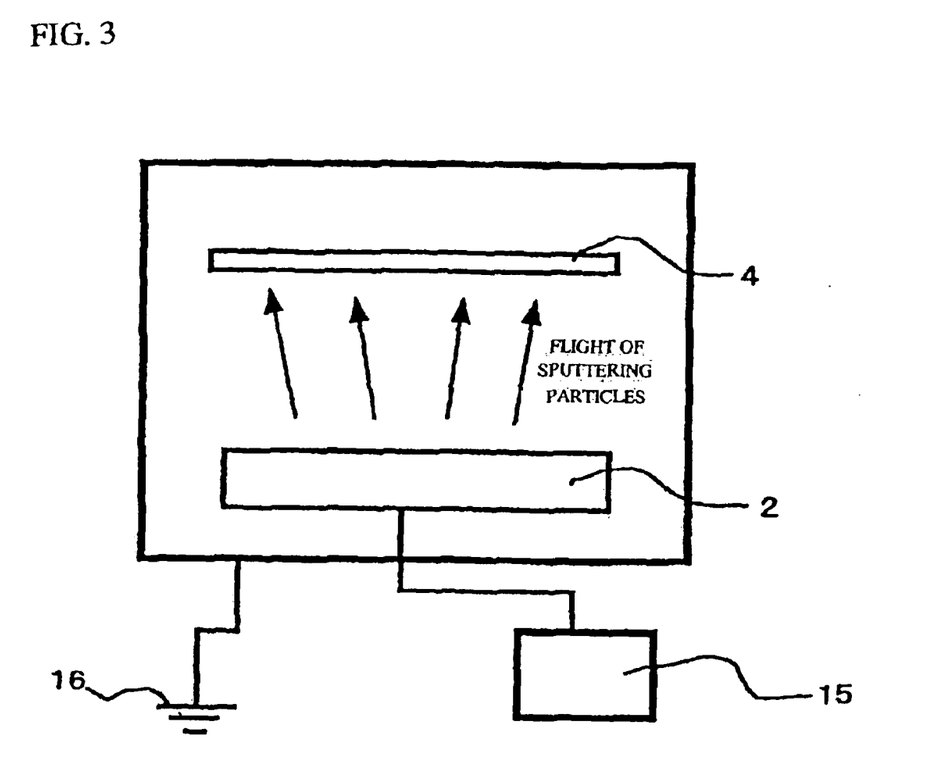
FIG. 3 is a schematic diagram showing a sputtering device using the photocatalyst film coating method of this invention (the DC planar method)

A metal target 2 comprising Ti as a main component containing 0.2 wt % Fe metal in a sputtering device connected to ground 16 shown in FIG. 3 (the sputtering rate of Fe and Ti was 2.16). After the film forming device was once exhausted to the vacuum state at 1.3×10$^{-3}$Pa, mixed gas of argon and oxygen (70% vol. % argon, 30 vol. % oxygen) was introduced and the pressure in the film forming device was maintained at 0.4 Pa. Thereafter, the target 2 was sputtered by providing a cathode with the power from a DC power source 15 and a 100 mm square size glass plate substrate 4 composed of soda lime silica was passed in front of the target, so that a 250 nm thick photocatalyst film was formed on the glass plate substrate 4. The film coating conditions and the photocatalyst activity evaluation results are shown in Table 1. When this glass plate substrate 4 was taken out of the film forming device and the photocatalyst activity of the photocatalyst film of the obtained article was evaluated, almost 100% of triolein was decomposed after 48 hours. As this article has a larger photocatalyst activity than the article obtained in the comparison example shown on Table 3, the improvement of the photocatalyst activity of the titanium oxide film formed by a method to mix metallic element Fe in a sputtering target was recognized.

Embodiment 2

Under the same conditions as those in Embodiment 1 excepting that a titanium metal target containing Fe in the added amount of 1 wt % on the metal base was used, a 250 nm thick photocatalyst film was coated on a glass plate. The coating conditions and the evaluation of the photocatalyst activity are shown on Table 1. The photocatalyst film of the obtained article has a larger photocatalyst activity than that of the article obtained in the comparison example shown in Table 3 described later and the effect of this invention was recognized.

Embodiment 3

Under the same conditions as those in Embodiment 1 excepting that a titanium target with 0.5 wt % V added (a ratio of the sputtering rates of V and Ti was 1.27) was used, a 250 nm thick photocatalyst film was formed on a glass plate. The coating conditions and the evaluation of photocatalyst activity are shown in Table 1. The photocatalyst film of the obtained article has a larger photocatalyst activity than that of the article obtained in the comparison example shown in Table 3 described later and the effect of this invention was recognized.

Embodiment 4

Figure 4:
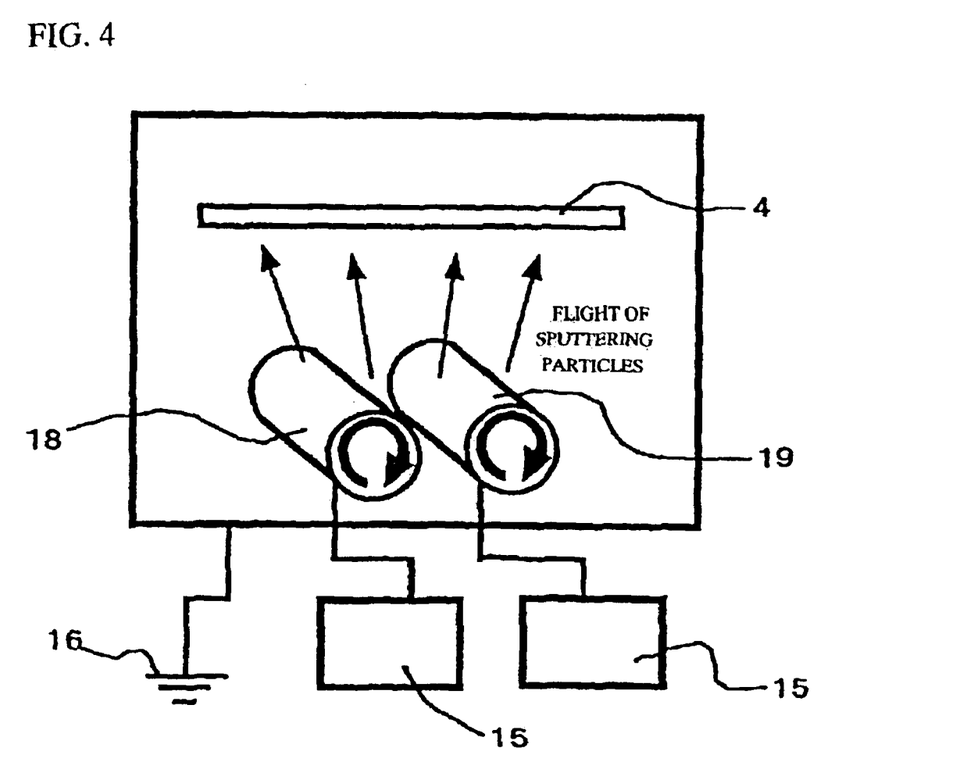
FIG. 4 is a schematic diagram showing another sputtering device using the photocatalyst film coating method of this invention (the dissimilar metals simultaneous discharge method)

Using a sputtering device connected to ground 16 having two rotational cylindrical targets 18 and 19 as shown in FIG. 4, a Mo doped titanium oxide film (50 nm thick) was formed on a glass substrate 4 by simultaneously discharging dissimilar targets of Ti and Mo (the ratio of Mo and Ti sputtering rates was 1.57). The doping amount of Mo added to the titanium oxide film was regulated by applying electric power from a DC sputter power source 15 to each target, separately. The coating conditions and the evaluation of the photocatalyst activity are shown in Table 1. The obtained article has a photocatalyst activity greater than that of the article obtained in the comparison example shown in Table 3 described later and the effect of this invention was recognized.

obtained in the comparison example shown in Table 3 and the effect of this invention was recognized.

Embodiment 7

Using a Ti target with 3 kinds of metals added: Fe, V and Mo shown in Table 2 as a Ti target, a titanium oxide film doped with the above-mentioned 3 kinds of metals was formed on a glass substrate 4 (the ratio of the sputtering rates of Fe and Ti was 2.16, that of V and Ti was 1.27 and that of Mo and Ti was 1.57) in the same manner as in Embodiment 6 excepting that a gas containing equal volumes of Ar and $O_2$ was used as the sputtering gas. The coating conditions

TABLE 1

| Item | Embodiment 1 | Embodiment 2 | Embodiment 3 | Embodiment 4 |
|---|---|---|---|---|
| [Coating Conditions] | | | | |
| Target composition | Ti—0.2Fe | Ti—1Fe | Ti—0.5V | Ti,Mo |
| Sputtering ratio (M/Ti) | 2.16 | 2.16 | 1.27 | 1.57 |
| Kind of target | Metal | Metal | Metal | Metal |
| Sputtering method | DC | DC | DC | Dissimilar metals same time discharging |
| Cathode shape | Planar | Planar | Planar | Cylindrical |
| Sputtering Gas | Ar:$O_2$ | Ar:$O_2$ | Ar:$O_2$ | Ar:$O_2$ |
| [Volume rate] | [= 70:30] | [= 70:30] | [= 70:30] | [= 70:30] |
| Substrate temperature (° C.) | Room temp. | Room temp. | Room temp. | Room temp. |
| Heat treatment after film forming | None | None | None | None |
| [Photocatalyst film] | | | | |
| Film composition | $TiO_2$:Fe | $TiO_2$:Fe | $TiO_2$:V | $TiO_2$:Mo |
| Added metal weight ratio | 0.2 | 1.0 | 0.5 | 3.0 |
| Film thickness (nm) | 250 | 250 | 250 | 250 |
| Photocatalyst activity evaluation | ◎ | ○ | ◎ | ○ |

Embodiment 5

Under the same conditions as those in Embodiment 1 except that a titanium metal target with 2 wt % of Nb added (the sputtering ratio of Nb and Ti was 1.18) was used, the photocatalyst film was formed on a glass plate and thereafter, heat treated for one hour at 300° C. in the atmosphere, and a 300 nm thick photocatalyst film was obtained. The coating conditions and the evaluation of the photocatalyst activity are shown in Table 2. The photocatalyst film has a photocatalyst activity greater than that of the article obtained in the comparison example shown in Table 3 described later and the effect of this invention was recognized.

Embodiment 6

Figure 5:
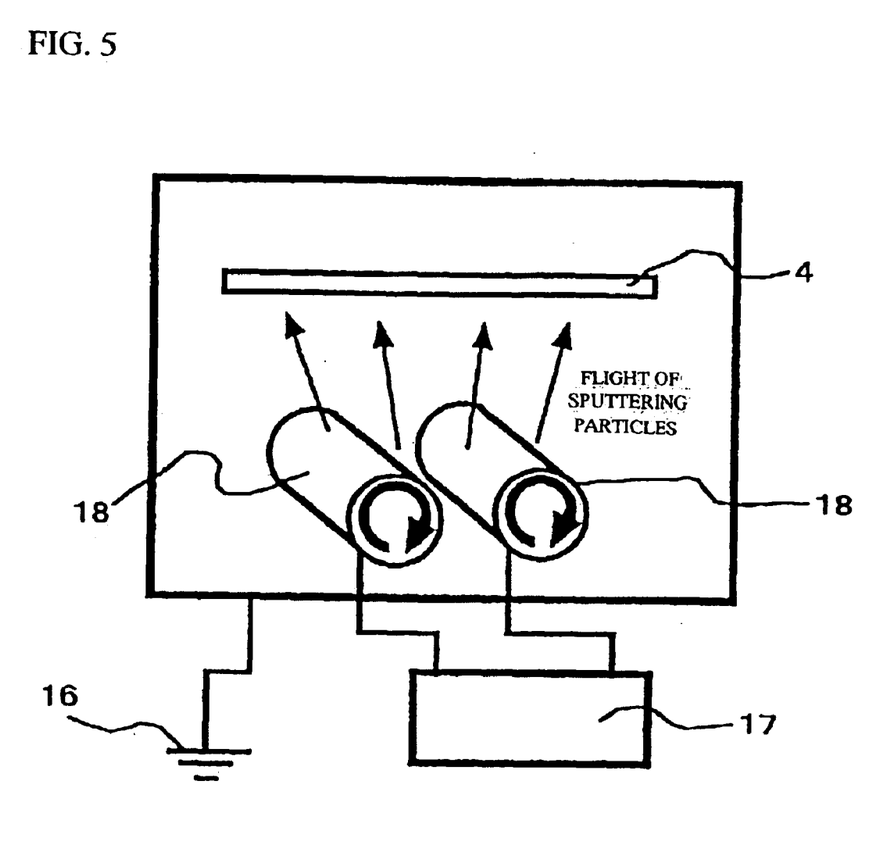
FIG. 5 is a schematic diagram showing yet another sputtering device using the photocatalyst film coating method of this invention (the DM method)

A titanium oxide film doped with two kinds of metals: Fe and V doped was formed on a glass substrate 4 by the DM method (the dual magnetron method). A sputtering device connected to ground 16, having a power source 17 and two rotational targets 18 as shown in FIG. 5 was used. The ratio of the sputtering rates of Fe and Ti was 1.27. The coating conditions and the evaluation of the photocatalyst activity are shown in Table 2. The photocatalyst film of the obtained article has a photocatalyst activity greater than the article and the evaluation of the photocatalyst activity are shown in Table 2. The photocatalyst film of the obtained article has a photocatalyst activity greater than that of the article obtained in the comparison example shown in Table 3 described later and the effect of this invention was recognized.

Embodiment 8

Using a titanium sub-oxide target with 3 kinds of metals added: Fe, V and Mo shown in Table 2, the titanium oxide film doped with these 3 kinds of metals was formed on a glass substrate 4 heated to 250° C. in the Ar gas (Ar: $O_2$=90:10) containing a small amount of $O_2$. The sputtering device connected to ground 16 including a DC power supply 15 and a rotating cylindrical target 18 shown in FIG. 6 was used. The ratio of the sputtering rates of Fe and Ti was 2.16 and that of Mo and Ti was 1.57. The coating conditions and the evaluation of the photocatalyst activity are shown in Table 2. The photocatalyst film of the obtained article has a photocatalyst activity greater than those of the article obtained in the comparison example shown in Table 3 described later and the effect of this invention was recognized.

TABLE 2

| Item | Embodiment 5 | Embodiment 6 | Embodiment 7 | Embodiment 8 |
|---|---|---|---|---|
| [Coating Conditions] | | | | |
| Target composition | Ti—2Nb | Ti—0.5Fe—0.5V | Ti—0.5Fe—1V—0.5Mo | Ti—0.5Fe—1V—0.5Mo |
| Sputtering ratio (M/Ti) | 1.18 | 2,16,1.27 | 2.16,1.27,1.57 | 2.16,1.27,1.57 |
| Kind of Target | Metal | Metal | Metal | TiOx Sub-Oxide |
| Sputtering Method | DC | DM Method | DM Method | DC |
| Cathode shape | Planar | Cylindrical | Cylindrical | Cylindrical |

TABLE 2-continued

| Item | Embodiment 5 | Embodiment 6 | Embodiment 7 | Embodiment 8 |
|---|---|---|---|---|
| Sputtering Gas | Ar:$O_2$ | Ar:$O_2$ | Ar:$O_2$ | Ar:O2 |
| [Volume rate] | [= 70:30] | [= 60:40] | [= 50:50] | [= 90:10] |
| Substrate Temperature (° C.) | Room temp. | Room temp. | Room temp. | 250 |
| Heat treatment after Film Forming | 300° C., 1 h | 250° C., 1 h | None | None |
| [Photocatalyst Film] | | | | |
| Film composition | $TiO_2$:Nb | $TiO_2$:Fe,V | $TiO_2$:Fe,V,Mo | $TiO_2$:Fe,V,Mo |
| Added Metal Wt. Ratio | 2.02 | Fe0.5,V0.5 | Fe0.5,V1,Mo0.5 | Fe0.5,V1,Mo0.5 |
| Film Thickness (nm) | 300 | 250 | 250 | 250 |
| Photocatalyst Activity Evaluation | ○ | ⊚ | ⊚ | ○ |

COMPARISON EXAMPLES 1 and 2

Articles having a photocatalyst film comprising titanium oxide containing no metal were coated on glass substrates. The coating conditions and the evaluation results of the obtained photocatalyst film are shown in Table 3. The photocatalyst activity of the obtained articles was lower than that of the articles in the embodiments.

| Item | Comparison Example 1 | Comparison Example 2 | Comparison Example 3 | Comparison Example 4 |
|---|---|---|---|---|
| [Coating Conditions] | | | | |
| Target Compositions | Ti | Ti | Ti—2.8Pt | Ti—4Pd |
| Ratio of Sputtering Rates (M/Ti) | — | — | 2.75 | 4.08 |
| Kind of Target | Metal | TiOx sub-oxide | Metal | Metal |
| Sputtering Method | DC | DC | DC | DC |
| Cathode shape | Planar | Cylindrical | Planar | Cylindrical |
| Sputtering Gas | Ar:$O_2$ | Ar:$O_2$ | Ar:$O_2$ | Ar:$O_2$ |
| [Volume rate] | [= 70:30] | [= 90:10] | [= 70:30] | [= 70:30] |
| Substrate Temperature (° C.) | Room temp. | 250 | Room temp. | Room temp. |
| Heat treatment after Film Forming | None | None | None | None |
| [Photocatalyst Film] | | | | |
| Film Composition | $TiO_2$ | $TiO_2$ | $TiO_2$:Pt | $TiO_2$:Pd |
| Added Metal Wt Rate | 0 | 0.0 | 2.8 | 4.0 |
| Film Thickness (nm) | 250 | 250 | 250 | 250 |
| Photocatalyst Activity Evaluation | Δ | X | Δ | X |

COMPARISON EXAMPLES 3 and 4

Photocatalyst film s doped with metals of which the sputtering rates of added metals and Ti were outside the scope of claims of this invention were produced. A titanium oxide film doped with Pt of which the ratio of the sputtering rate to Ti is 2.75 was produced in Comparison Example 3 and a titanium oxide film doped with Pd of which the ratio of the sputtering rate was 4.08 was produced in Comparison Example 4 using the same method as in Embodiment 1. The coasting conditions of the film and the evaluation results of the obtained photocatalyst films are shown in Table 3. The photocatalyst activity of the obtained articles was lower than that of the articles in the embodiments and the effect of this invention is clear.

From the embodiments and the comparison examples shown above, it is clear that the photocatalyst film described in the embodiments of this invention has a more improved photocatalyst activity than a photocatalyst film that is composed of titanium oxide only or a photocatalyst film having a ratio of the sputtering rates of metal and Ti outside the range of the claims of this invention. Further, it can be seen that when coating a photocatalyst film on a substrate by the sputtering method using a set of two cathodes, voltage is applied to these two cathodes so as to reverse the polarity of the cathodes alternately. It is also clear that when a Ti metal target or a Ti suboxide target with a specified metal of this invention added is used, it is possible to supply a film doped with a specified metal ion, having a high photocatalyst activity, efficiently and stably.

A photocatalyst film comprising titanium oxide as a main component of an article of this invention contains specified metals in a specified amount, which increase the photocatalyst activity.

A photocatalyst coating film of this invention is formed on a substrate by a sputtering method using a Ti metal target or a Ti sub-oxide target containing at least one metal having a sputtering rate for Ar of 0.9 to 2.7 times that of Ti. Ar has at least a kind of energy in a 30 to 5000 eV ion energy area. Therefore, non-uniformity and segregation of doping metals can be prevented and thereby, a drop in the photocatalyst activity can be suppressed. Also, this photocatalyst film is applicable to a substrate comprising material having a relatively small heat resistance.

When a Ti metal target or a Ti sub-oxide target with a specified metal of this invention added is used, it is possible to supply a photocatalyst film doped with a specified metal ion, having a high photocatalyst activity efficiently and stably.

In addition, by a method for coating a photocatalyst film on articles of this invention, a photocatalyst film having a large photocatalyst activity can be coated at a high coating speed.

What is claimed is:

1. A Ti metal sputtering target comprising at least one metal having a sputtering rate for Ar which has at least one kind of energy in the ion energy range of 100 to 2000 eV, being 0.9 to 2.7 times that of Ti, selected from the group of metals consisting of Fe, V, Mo, Nb, Al and Cr in an amount of 0.01 to 10 wt % in terms of the sum of such metals.

2. A Ti sub-oxide sputtering target comprising at least one metal having a sputtering rate for Ar which has at least one kind of energy in the ion energy range of 100 to 2000 eV, being 0.9 to 2.7 times that of Ti, selected from the group of metals consisting of Fe, V, Mo, Nb, Al and Cr in an amount of 0.01 to 10 wt % in terms of the sum of such metals.

3. A method for preparing a photocatalyst film coated article, characterized in that the article is prepared by a reactive sputtering method using oxygen gas and at least a sputtering target described in claim 1 in a method for coating a substrate with a photocatalyst film comprising titanium oxide as a main component and at least one kind of metal having a sputtering rate for Ar, which has at least one kind of energy in a 100 to 2000 eV ion energy area, being 0.9 to 2.7 times that of Ti.

4. A method for preparing a photocatalyst film coated article, characterized in that the article is prepared by a sputtering method using at least a sputtering target described in claim 2 in a method for coating a substrate with a photocatalyst film comprising titanium oxide as a main component and at least one kind of metal having a sputtering rate for Ar, which has at least one kind of energy in a 100 eV to 2000 eV ion energy area, being 0.9 to 2.7 times that of Ti.

* * * * *